United States Patent [19]

Nishizawa

[11] Patent Number: 4,874,458

[45] Date of Patent: Oct. 17, 1989

[54] SINGLE CRYSTAL GROWING METHOD HAVING IMPROVED MELT CONTROL

[75] Inventor: Minoru Nishizawa, Tokyo, Japan

[73] Assignee: Gakei Electric Works Co., Ltd., Tokyo, Japan

[21] Appl. No.: 675,409

[22] Filed: Nov. 27, 1984

[30] Foreign Application Priority Data

Aug. 31, 1984 [JP] Japan .................. 59-182435
Aug. 31, 1984 [JP] Japan .................. 59-182436
Aug. 31, 1984 [JP] Japan .................. 59-182437

[51] Int. Cl.$^4$ ............................ C30B 15/24
[52] U.S. Cl. .................. 156/607; 156/618.1; 156/DIG. 98; 156/601
[58] Field of Search .............. 156/601, 607, 617 SP, 156/618, DIG. 98, 618.1, 617.1, DIG. 88; 422/249; 219/10.77, 422, 425

[56] References Cited

U.S. PATENT DOCUMENTS

| | | | |
|---|---|---|---|
| 3,621,213 | 11/1971 | Jen et al. | 156/601 |
| 4,096,024 | 6/1978 | Dusserre et al. | 156/601 |
| 4,196,171 | 4/1980 | Watanabe et al. | 156/607 |
| 4,267,154 | 5/1981 | Mueller et al. | 422/249 |
| 4,314,128 | 2/1982 | Chitre | 156/617 SP |
| 4,497,777 | 2/1985 | Kojima | 156/607 |
| 4,556,784 | 12/1985 | Nakai | 219/425 |

FOREIGN PATENT DOCUMENTS

| | | | |
|---|---|---|---|
| 62880 | 5/1975 | Japan | 156/601 |
| 21972 | 2/1979 | Japan | 156/601 |
| 25281 | 2/1979 | Japan | 156/601 |
| 859490 | 7/1982 | U.S.S.R. | 156/601 |
| 824341 | 11/1959 | United Kingdom | 156/617 H |
| 2109267 | 6/1983 | United Kingdom | 156/618 |

Primary Examiner—David L. Lacey
Attorney, Agent, or Firm—Fleit, Jacobson, Cohn, Price, Holman & Stern

[57] ABSTRACT

In a single crystal growing technique (crystal pulling) a method for minimizing impurity contamination and preventing heat convection currents from affecting the solid-melt crystal growing interface which uses a floating baffle plate in the interior of the feed melt containing crucible in order to obtain a single crystal of a compound semiconductor having a high melting point and exhibiting a high dissociation pressure at said melting point such as a compound semiconductor of Groups III-V, especially GaAs or Gap, the crystal having a small dislocation density. Improvement is made on the shape of the baffle plate and on baffle plate control mechanisms, and this baffle plate is combined with selected intra-furnace pressure or heating mechanisms or temperature measuring mechanisms.

5 Claims, 6 Drawing Sheets

SINGLE CRYSTAL GROWING METHOD HAVING IMPROVED MELT CONTROL

BACKGROUND OF THE INVENTION

1. Field of the Invention

The present invention relates to a single crystal growing method and apparatus suitable for use in pulling a crystal from a melt of a compound semiconductor of elements of Groups III-V, especially gallium arsenide (GaAs), according to the Czochralski method.

2. Description of the Prior Art

For compound semiconductors of the type noted to fully exhibit their intrinsic optical and electrical characteristics, it is necessary that the single crystals prepared have a high purity and a high perfectness of crystal.

Compound semiconductors of elements of Groups III-V such as GaAs, gallium phosphide (GaP) and indium phosphide (InP) melt as high as 1238° C., 1470° C. and 1050° C. and exhibit high dissociation pressures (0.9, 30 and 15.5 atm respectively) at such melting points. Growing these compound semiconductors according to the known crystal pulling methods is extremely difficult.

Single crystals of GaAs are in increasing demand because they exhibit larger electron transfer than silicon (Si) when compared on a size or dimensional basis. Presently, the method used to obtain such GaAs single crystal is the well known horizontal Bridgman method. This method has the drawback that contamination may be caused by impurities diffused or transferred to the GaAs as the single crystal made is being supported by a quartz board or a quartz sealed tube. Also, according to this known method, the sectional shape of a grown crystal is not circular and this is a disadvantage. Recently, because of these technical problems and difficulties, various efforts have been made to try to grow such single crystals according to the Czochralski method.

According to the well known Czochralski method, in principle, a single crystal of a higher purity can be obtained than what is obtainable according to the horizontal Bridgman method. In the case of GaAs in particular, and also GaP and InP, a technical problem still exists concerning the perfectness of crystals obtainable. Thus, research is continuously being made searching for a way to obtain crystals of such materials characterized by a smaller dislocation density.

Those skilled in this art well know and appreciate that the presence of excessive dislocations or a large dislocation density cause the electrical and optical characteristics of a semiconductor device made from these single crystals to be deteriorated or to show an abnormality.

Such dislocations are sometimes created during the device manufacturing process, but in most cases are present from the beginning in GaAs single crystal used as a substrate for manufacturing a device. The dislocations present in the substrate are caused mainly by a heat distortion during production of the single crystal, and this heat distortion is sometimes caused by an abrupt temperature gradient in the interior of the crystal induced by a convection current of an inert gas which is being used to establish an inert atmosphere of a high pressure in the crystal growing furnace. One major cause of dislocations is considered to be any nonuniform temperature distribution at the solid-melt interface caused by a heat convection current which occurs in the feed melt.

To prevent such heat convection, it is already known to float a heat convection preventing plate in a position below the surface of the feed melt when pulling a single crystal, the heat convection preventing plate having a diameter somewhat larger than that of the single crystal being grown but fairly smaller than that of the crucible containing the feed melt. This technique is effective against a heat convection current travelling from the center toward the outside in the feed melt, but is not always fully effective against a heat convection current travelling from the outside toward the center.

Further, it is known to float a convection preventing plate in a position below the surface of a feed melt by virtue of its buoyancy, the convection preventing plate having a diameter larger than that of the single crystal being pulled and somewhat smaller than the inside diameter of the crucible, and to conduct the feed melt upwardly beyond the convection preventing plate through fine holes formed in the plate or through a gap formed between the outer periphery of the convection preventing plate and the inner periphery of the crucible. But, when the feed melt is viscous, it does not pass smoothly through the fine holes and/or the gap, thus, slowing down the pulling operation and thereby increasing the time required to grow a crystal. Also, if carelessness results in a deficiency of the feed melt in the single crystal pulling region, this would cause great difficulties.

Further causes of dislocation are heat radiation from a liquid sealing agent such a $B_2O_3$ which is often used to cover the upper surface of a feed melt, and heating differentials resulting from lowering of the feed melt level in the crucible as the crystal growth proceeds and are especially evident at the end of the single crystal pulling operation when the conditions are substantially altered from those at the beginning of the operation. The crucible plays the role of a heat retaining cylinder as the single crystal pulling operation progresses, thus making effective temperature control (control of a constant temperature gradient) extremely difficult.

At present, the internal temperature of a crucible containing feed melt is merely estimated by a thermocouple disposed outside the crucible. But from the above discussion, one can readily appreciate that such an arrangement is a coarse control and quite insufficient and unsatisfactory as a temperature measuring means for pulling a single crystal of a compound semiconductor as noted above. In such a case, the pulling operation requires the prevention of temperature variations which cause a heat distortion and providing and making an exact control.

OBJECTS AND SUMMARY OF THE INVENTION

It is a primary object of the present invention to provide a single crystal growing method and apparatus capable of obtaining a crystal of a high purity and a small dislocation density when produced according to the general teachings of the Czochralski method, the particular single crystal having a high melting point and exhibiting a high dissociation pressure at its melting point, such as a compound semiconductor of elements of Groups III-V.

It is a secondary object of the present invention to provide a single crystal growing method and apparatus in which heat convection currents of a feed melt can be completely prevented from affecting the single crystal pulling operation or the solid-melt interface, and the feed melt can be fed smoothly onto the solid-melt interface without excess or deficiency through a gap formed between the outer periphery of a baffle plate and the inner wall of the crucible containing the feed melt.

It is a further object of the present invention to provide an apparatus capable of measuring temperature extremely accurately and of controlling accurately the temperature of those portions of the crystal growing operation which require an accurate temperature control, such as the feed melt, the solid-melt interface region and the liquid sealing agent region.

According to the present invention, in order to achieve the above-mentioned technical objects when pulling a single crystal from a feed melt, a baffle plate, having an outside diameter somewhat smaller than the inside diameter of a crucible and also having a feed melt guiding portion at least on its outer periphery, is floated vertically movably in a predetermined position below the surface of the feed melt, and is maintained at a predetermined spacing from the surface of the feed melt while the crucible and/or the baffle plate are rotated during the single crystal pulling operation.

Moreover, in order to prevent impurity contamination, the baffle plate is formed of alumina ($Al_2O_3$), silicon nitride ($Si_3N_4$), BN (boron nitride) or PBN (pyrolytic boron nitride). A molybdenum heater is used to heat the crucible and the feed melt.

Further, the baffle plate is held in proper position by being pressed down from above or by being fixed to a plurality of moving rods which are suspended vertically axially movable. Thus, the baffle plate can be maintained in its predetermined position as the feed melt lowers. Also, the baffle plate can be held in set position and the crucible moved up and down.

According to the present invention, moreover, in pulling a single crystal by the liquid encapsulated method, the interior of the furnace containing the crucible and feed melt is held in at high pressure and in an inert gas atmosphere; a baffle plate is floated in a predetermined position below the surface of the feed melt; a control is provided to maintain the predetermined spacing between the baffle plate and the feed melt surface during the single crystal pulling operation; and a plurality of heating means are coaxially provided around the crucible with the plurality of heating means being each controlled independently.

According to the present invention, moreover, in pulling a single crystal from a feed melt, there are provided a plurality of heating means and axially movable temperature measuring means. The plurality of heating means are each controlled independently in accordance with a detected signal provided from the temperature measuring means which measures the temperature of preselected regions or points in the crucible and/or the melts contained in the crucible.

Further, according to the present invention, when floating a baffle plate in the feed melt contained in the crucible, a temperature measuring means is enclosed or otherwise provided for in a single or plural moving rods which support or hold the baffle plate.

Moreover, the single crystal pulling apparatus of the present invention comprises a pressure- and heat-resistant electric furnace, a single crystal pulling shaft which is driven non-invasively within the electric furnace such as by a magnetic mechanism, a feed melt holding crucible placed and fixed on the upper portion of a crucible supporting rod which is also driven non-invasively within the electric furnace such as by a magnetic mechanism, a liquid sealing agent floated on the surface of the feed melt in the crucible, a baffle plate held in a predetermined position below the feed melt surface, means for maintaining the predetermined spacing between the baffle plate and the feed melt surface while pulling a single crystal, a plurality of heating means mounted in an axially vertically arranged fashion around the outside of the crucible, and means for controlling the plurality of heating means each independently.

Under the construction described above of the invention, a heat convection current created in the feed melt will be prevented from disturbing or affecting the solid-melt interface, and the temperature distribution at this particular area will be rendered flat and uniform. Also, it is possible to prevent heat radiation through the liquid sealing agent. Further, the temperature of the feed melt, the solid-melt interface or the liquid sealing agent can be measured directly and accurately during the single crystal pulling operation, and by controlling the plural heating means in accordance with detected signals, it is possible to make an accurate temperature control with little temperature variation and thereby minimize the occurrence of a heat distortion, so that the dislocations that would otherwise be caused by such heat distortion are prevented and a single crystal of an extremely small dislocation density can be obtained. Also, the impurity contamination of the crystal can be minimized.

In the present invention, moreover, by holding the furnace interior at a high pressure under an inert gas atmosphere, it is possible to prevent the dissipation of a volatile component, and even though such high pressure inert gas atmosphere is present, gas-tightness (hermetic seal) can be ensured completely, under which condition a smooth movement of the drive system is ensured. Further, the baffle plate can be held in a predetermined extremely stable position in the crucible during the single crystal pulling operation.

The above and other objects, features and advantages of the invention will become clear from the following description of the preferred embodiment taken in conjunction with the accompanying drawings.

DESCRIPTION OF THE PREFERRED EMBODIMENTS

Figure 1:
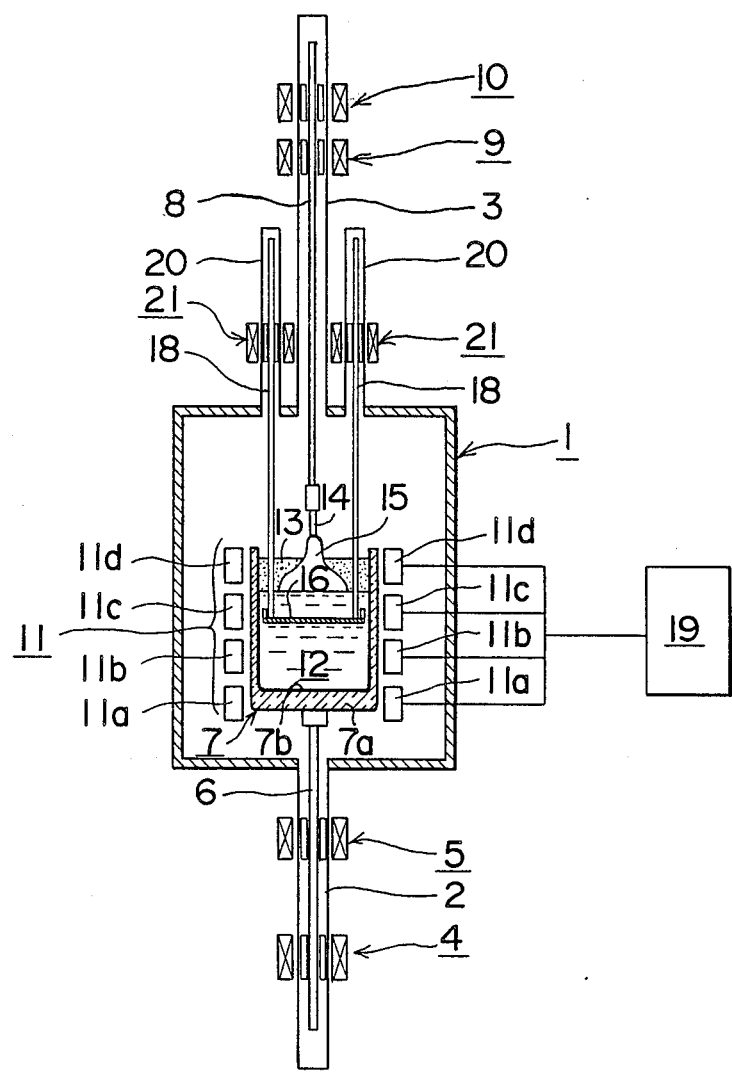
FIG. 1 is a schematic view illustrative of the present invention.
Figure 3:
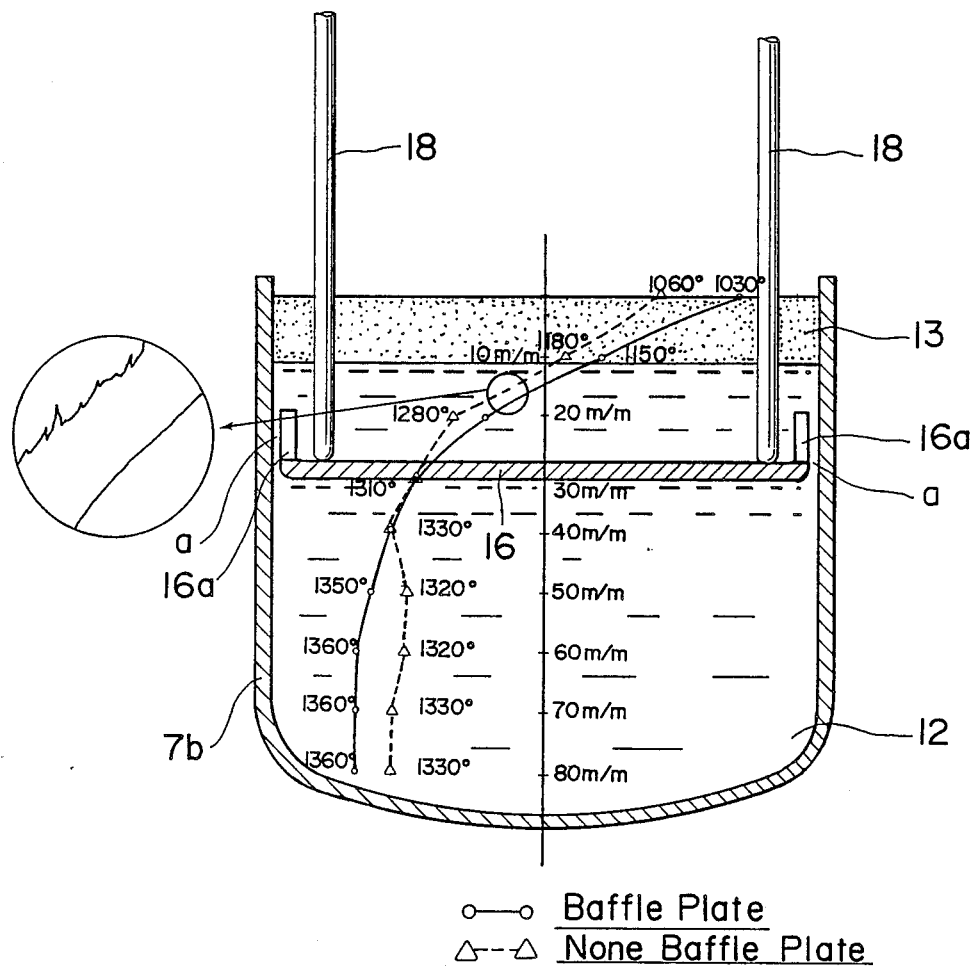
FIG. 3 is a view illustrative of temperature gradient and temperature variation.

Referring first to FIGS. 1 and 3, the reference numeral 1 denotes a pressure- and heat-resistant electric furnace of a completely closed hermetically sealed structure with thin-walled cylinders 2 and 3 centrally projecting axially vertically therefrom. The electric furnace 1 is made of stainless steel, for example. In the lower cylinder 2 is enclosed gas-tightly a crucible supporting rod 6, with a vertical movement drive mechanism 4 and a rotation drive mechanism 5 being disposed therearound, both drive mechanisms 4 and 5 utilizing a magnetic force. For drive mechanisms 4 and 5 may be used those drive mechanisms which are disclosed in my copending application Ser. No. 675,404 filed even date hereof, now U.S. Pat. No. 4,569,828, entitled "Crystal Pulling Apparatus for Making Single Crystals of Compound Semiconductors Containing a Volatile Component." On the upper end portion of the crucible supporting rod 6 is fixed a crucible 7 comprising an outer crucible 7a formed of, for example, graphite and an inner crucible 7b formed of, for example, quartz.

In the upper cylinder 3 is enclosed gas-tightly a single crystal pulling rod 8 with a vertical movement drive mechanism 10 and a rotation drive mechanism 9 being disposed therearound, both drive mechanisms 10 and 9 utilizing a magnetic force. For drive mechanisms 9 and 10, the ones disclosed in the aforementioned copending application may be used. Outside the crucible 7 are coaxially disposed a heating means 11 comprising heaters 11a, 11b, 11c and 11d which are controlled independently of one another and which are formed preferably of molybdenum. The heaters 11a, 11b, 11c and 11d are controlled independently in accordance with a signal provided from a thermocouple (not shown) by means of a conventional temperature control box 19 so that a predetermined temperature gradient is created in which the higher the position or location in the crucible, the lower the temperature. In the crucible 7 is contained a feed melt 12, e.g. GaAs, the upper surface of which is covered with a liquid sealing agent 13, e.g. $B_2O_3$. In the illustrated embodiment, a GaAs single crystal 15 is being pulled by means of a seed crystal 14 attached to the lower or fore end of the single crystal pulling rod 8. The crystal 15 is pulled through the liquid sealing agent 13.

Figure 2:
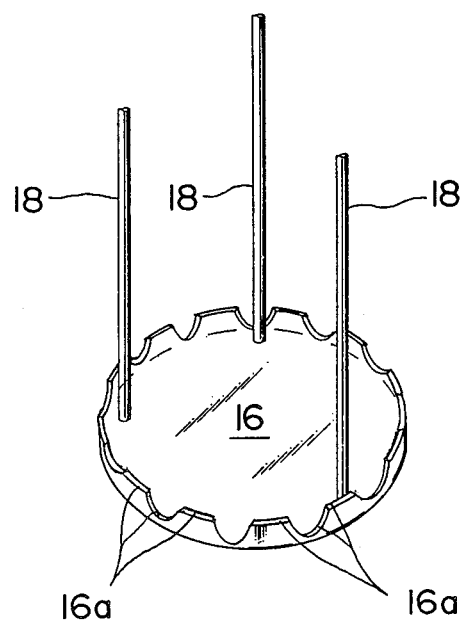
FIG. 2 is a perspective view of a baffle plate.

In a predetermined position below the surface of the feed melt 12 is floated an unperforated baffle plate 16 (best shown in FIG. 2) by being held down by three movable or control rods 18 which contact or engage the upper surface of baffle plate 16 and which are suspended from above the crucible 7, the baffle plate 16 having an outside diameter somewhat smaller than the inside diameter of the crucible 7. The baffle plate 16 is held down through the control rods 18 by a force equal to that necessary to counterbalance the bouyancy of the baffle plate and maintain the same at the predetermined position (or spacing) from the surface of the feed melt as the crystal 15 is grown. The baffle plate 16, as shown in FIG. 2, has an upturned flange about its periphery which is cut out at spaced intervals to form a scalloped edge. The flange defines feed melt guiding portions 16a which appear as a wavy unevenness on the upper surface of its outer periphery. Baffle plate 16 is formed of $Al_2O_3$, $Si_3N_4$, BN, or PBN. The moving rods 18 are formed of BN, for example. These three moving rods 18 are suspended from cylinders 20 which are vertically erected on the electric furnace 1 radially spaced about cylinder 3 so as to constitute a regular triangle with the upper cylinder 3 as the center. Cylinders 20 like cylinders 2 and 3 and furnace 1 are all hermetically sealed. The thus-suspended moving rods 18 are adapted to be vertically moved simultaneously by means of non-invasive drive mechanisms 21 which utilizes, for example, a magnetic force. Such an arrangement is disclosed in my copending application Ser. No. 674,410 filed even date herewith, now U.S. Pat. No. 4,721,601 and entitled "Apparatus for Positioning and Locating a Baffle Plate in a Crucible."

Thus, the moving shafts such as the crucible supporting rod 6, single crystal pulling rod 8 and control rods 18 are driven by the non-invasive drive mechanisms utilizing, for example, a magnetic force, so even when the interior of the electric furnace 1 is filled with an inert gas of a high pressure, the gas-tightness of the furnace is fully maintained and the rods and shafts can be moved smoothly in the high pressure atmosphere.

Further, since the outside diameter of the baffle plate 16 is a little smaller than the inside diameter of the crucible 7, a heat convection current in the feed melt 12 occurring below the baffle plate 16 and advancing from the center toward the outside, as well as a heat convection current advancing from the outside toward the center, will be obstructed by the baffle plate 16 and have no influence upon the upper surface of the baffle plate 16. Consequently, as shown in FIG. 3, the temperature of the solid-melt interface region above the upper surface of the baffle plate 16 is extremely more stable in comparison with what it would be were the baffle plate not used.

Further, by holding the heaters 11a, 11b and 11c at 1400° C. and the heater 11d at 1200° C., as shown also in FIG. 3, the temperature is higher by 30° C. in a lower position of the crucible and lower by 30° C. on the upper surface of $B_2O_3$ than would be the case in the absence of the baffle plate 16. Thus, the single crystal being pulled is better able not to be thermally distorted by the radiation heat from $B_2O_3$.

Further, in the case where the feed melt guiding portions 16a are formed on the upper surface of the outer periphery of the baffle plate 16, the guiding portions 16a comprised of alternate projections and cut outs function to roll in and draw up the feed melt 12 from the lower surface to the upper surface of the baffle plate 16 through a gap (a) with rotation of the baffle plate 16 or the crucible 7, whereby the feed melt 12 can be fed always smoothly to the solid-melt interface region above the baffle plate 16 without excess or deficiency. In this respect, a superior effect is exhibited as compared with the construction in which the feed melt is passed through fine holes formed in the baffle plate 16 itself or through a gap formed between the outer periphery of a flat baffle plate and the inner wall of the crucible.

Further, since the guiding portions 16a function to guide the feed melt from the outer periphery of the crucible 7 to the solid-melt interface region on the upper central portion of the crucible 7, the temperature of the guided feed melt falls a little in the meantime so that the temperature distribution of the solid-melt interface region can be prevented from experiencing distortion.

Further, since the guiding portions 16a function to stir the feed melt on the baffle plate 16, the growth of the single crystal is sped up.

The guiding portions 16a may be constituted by plural openings which are formed in the upstanding periphery wall of the baffle plate 16. The guiding portions 16a also may be constituted by plural openings or wavy unevenness formed in a radial direction of the baffle plate 16. The plural openings and the wavy unevenness may be shaped or tapered or bent edges or fins for cutting the feed melt.

It has been discovered that by using molybdenum wires as the heaters 11a, 11b, 11c and 11d, the impurity contamination from the wire heaters is minimized.

The baffle plate 16 may be fixed to the lower or fore end of the control rods 18, or only a single rod 18 may be used. In the case of fixing the baffle plate 16 to the rods 18, there is the advantage that the baffle plate 16 can be used repeatedly. If a peep glass is used for the furnace, a baffle plate fixed to a rod 18 and withdrawn to a certain position, such as raised before heating is commenced, may obstruct the view of the peep glass.

A GaAs single crystal was pulled as follows using the apparatus illustrated in FIGS. 1 and 3.

First, into the crucible 7 having an inside diameter of 90 mm and a depth of 100 mm was placed 1,700 g of polycrystalline GaAs, then 300 g of $B_2O_3$ was placed thereon. The baffle plate 16 formed of BN was put on the upper surface of the $B_2O_3$.

Then, the crucible 7 was placed inside the heating means 11 and the interior of the furnace 1 was vacuum evacuated. Thereafter, the interior of the furnace 1 was pressurized to 100 atm with argon as the inert gas, and the temperature of the heaters 11a, 11b and 11c raised to 1400° C., while that of the heater 11d was raised to 1200° C., to melt the GaAs. $B_2O_3$ was the first to melt and then the GaAs polycrystalline material melted and the baffle plate 16 floated on the feed melt 12 below the $B_2O_3$ which became about 11 mm (m/m) in thickness due to its specific gravity. This melted state was confirmed through a peep glass (not shown) and the rods 18 were moved down to immerse the baffle plate 16 into the feed melt 12 to a position in which the spacing between the upper surface of the baffle plate 16 now located below the surface of the melt and the lower surface of $B_2O_3$ was about 17 mm.

Then, the single crystal pulling rod 8 was moved down to immerse the seed crystal 14 attached to its lower or fore end into the feed melt 12 through the $B_2O_3$ layer, and the rod 8 was rotated at a rate of about 8 r.p.m. to have the seed crystal contacted thoroughly with the feed melt 12, while the crucible was rotated in the opposite direction also at a rate of 8 r.p.m. The single crystal was pulled in the direction of [111] at a rate of about 15 mm/hr. During this pulling operation, the baffle plate 16 was moved down by the rods 18 to maintain its predetermined position below the surface of the feed melt 12.

The GaAs single crystal thus obtained was 50 mm in diameter and 150 mm in length, and its etch bit density was $1.2 \times 10^4$ cm$^{-2}$ at the portion 10 mm from the outer periphery, $4.2 \times 10^3$ cm$^{-2}$ at 15 mm from the outer periphery and $6.7 \times 10^4$ cm$^{-2}$ at 20 mm from the outer periphery. Defects such as dislocations were scarcely recognized in this single crystal, and thus, the single crystal growing method of the present invention proved to be very superior even in comparison with the horizontal Bridgman method.

Although the above example concerns pulling a single crystal of GaAs, it goes without saying that the process of the present invention is also applicable to the pulling of single crystals of other compound semiconductors such as, for example, GaP and IaP and perhaps may have some applicability to pulling crystals of Si and Ge.

The baffle plate may be held down from above my control rods 18 or, alternatively, the baffle plate and the rods may be integrally fixed to each other. The former possibility is advantageous in that since the baffle plate is enclosed beforehand in the crucible, it is not an obstacle to viewing through a peep glass no matter in which position the peep glass is located, but has the disadvantage that the baffle plate remains in the crucible and solidifies together with the residual feed melt, thus running to waste at every manufacturing process. On the other hand, the latter possibility is disadvantageous in that since the baffle plate must be pulled up outside the crucible before melting, the view through the peep glass may be obstructed in some particular position thereof, but has the advantage that the baffle plate can be used repeatedly because it can be pulled up outside the crucible after completion of the single crystal pulling operation.

Further, it has been found that where the baffle plate is of a small diameter and a large thickness and the control rod is thick and strong, only one rod may be used. Where the baffle plate is thin and the rod is not so thick, it is desirable to use plural rods, or else the support for the baffle plate becomes unstable.

Figure 4:
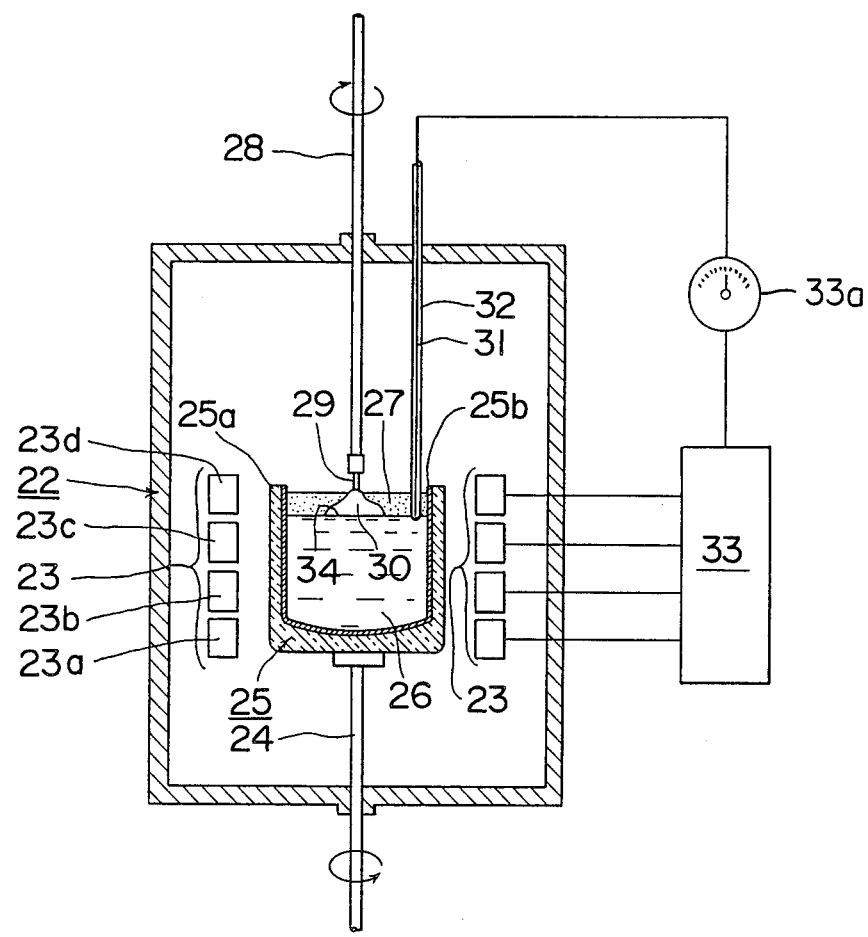
FIG. 4 is a schematic view illustrating another embodiment of the invention.
Figure 5:
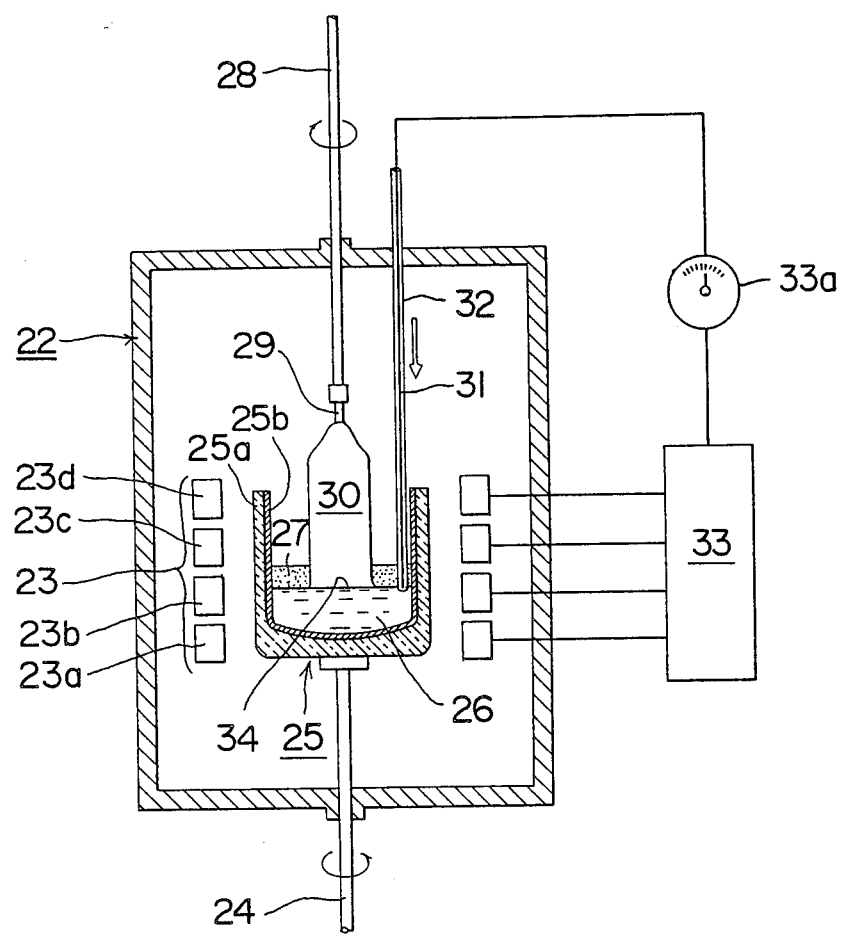
FIG. 5 is a schematic view illustrating an advanced state of pulling of a single crystal.

Referring now to FIGS. 4 and 5, there is illustrated another embodiment of the present invention, in which the numeral 22 denotes an electric furnace and the numeral 23 denotes a heating means comprising, for example, axially quartered heaters 23a, 23b, 23c and 23d. Inside the heating means 23 is disposed a crucible 25 fixed on a crucible supporting rod 24 which is inserted gas-tightly into the furnace 22 rotatably and vertically movably in the manner previously explained. The crucible 25 comprises an outer crucible 25a formed of, for example, graphite and an inner crucible 25b formed of, for example, quartz, and it contains a feed melt 26 which is GaAs, for example. On the upper surface of the feed melt 26 of GaAs, a liquid sealing agent 27 such as $B_2O_3$ is kept floating due to its specific gravity. From above the crucible 25 is suspended a rotatable and vertically movable (as described) single crystal pulling rod 28 gas-tightly through the furnace 22, and from a seed crystal 29 attached to the lower or fore end thereof is growing a single crystal 30 whose lower or fore end is immersed in the feed melt 26 through the liquid sealing agent 27.

A protective tube 32 formed of, for example, BN with a temperature measuring means 31 such as a thermocouple or the like enclosed therein is suspended from above into the furnace vertically movably (as described) and is situated between the single crystal 30 being pulled up and the inner wall of the crucible 25, with its lower or fore end immersed into the feed melt 26. A temperature signal detected by the temperature measuring means 31 is displayed on an indicating meter 33a and at the same time it is fed to a conventional temperature controller 33, whereby the heaters of the heating means 23 are controlled each independently.

Before the feed melt 26 is prepared, the protective tube 32 is pulled up above the crucible 25, and after preparation of the feed melt 26, the tube 32 is moved down to measure the temperature of the solid-melt interface region to know the temperature suitable for crystal pulling exactly, and to control the temperature at which the seed crystal 29 is immersed and pulled up. During the pulling operation, the protective tube 32 is moved up and down by any known means (such as described earlier) to measure the temperature of any accessible point in the crucible to ascertain the temperature of, for example, the feed melt 26, solid-melt interface 34 and liquid sealing agent 27. The detected temperature signals are fed to the temperature controller 33 to adjust the temperature of the heating means 23. Even when the liquid level in the crucible lowers with advancement of the single crystal pulling operation as shown in FIG. 5, it is possible to pull the single crystal with little temperature variation under an exact temperature control scarcely different from that at the beginning of the pulling operation.

Figure 6:
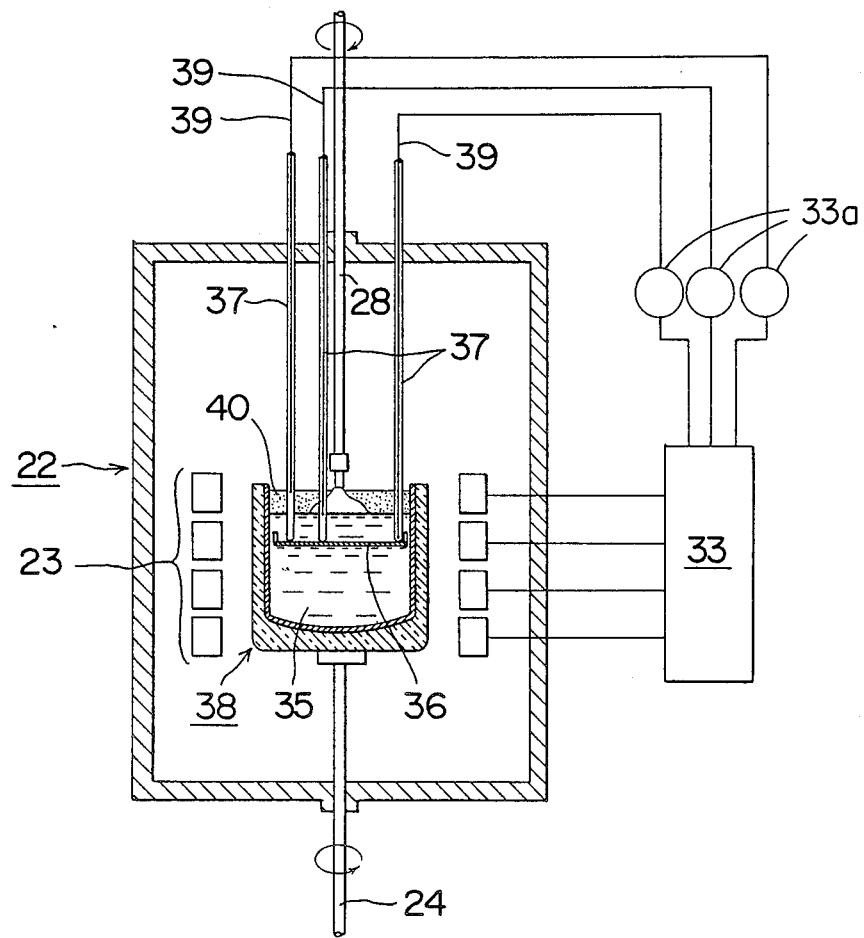
FIG. 6 is a schematic view illustrating a further embodiment of the invention.

Referring now to FIG. 6, there is illustrated a further embodiment of the present invention, in which a baffle plate 36 for preventing heat convection is floated in a feed melt 35, and a plurality of rods 37 formed of, for example, BN, are used to hold the baffle plate 36 suspended vertically axially movably in crucible 38. In each of the rods 37 is enclosed a temperature measuring means 39 comprising a thermocouple, for example, which is spatially located with respect to the baffle plate 36, that is, is located spaced from the end of rod 37 to be in position to measure the temperature at a preselected point or region in the feed melt, crucible or liquid sealing layer.

This arrangement is advantageous in that the temperatures of plural regions in the crucible 38 can be measured at the same time whereby a more exact temperature control can be effected. In this embodiment, the temperature of the upper surface of the baffle plate 36, that of the upper surface of the feed melt 35 and that of the upper surface of a liquid sealing agent 40 can be measured at the same time.

What is claimed is:

1. A method of growing a single crystal comprising pulling a single crystal from a feed melt contained in a crucible under a high pressure inert gas atmosphere, covering the surface of the feed melt with a liquid sealing agent, floating an unperforated baffle plate having an outside diameter somewhat smaller than the inside diameter of the crucible in a predetermined position below the surface of the feed melt to define a spacing between the baffle plate and the surface of the feed melt and to define a gap between outside and inner peripheries of the baffle plate and the crucible, respectively, controlling the spacing between said baffle plate and the surface of the feed melt so that said spacing is maintained at a predetermined spacing during pulling of the single crystal, causing relative rotation between the baffle plate and the crucible, the periphery of the baffle plate including a feed melt guiding portion which causes movement of the feed melt from below the baffle plate smoothly upward through the gap between the relatively rotating baffle plate and the crucible to a solid-melt interface region above the baffle plate, heating discrete vertically spaced points in the feed melt preselectedly and controlling the heat applied to said discrete vertically spaced points in the feed melt.

2. A method of growing a single crystal according to claim 1, wherein said baffle plate is made from a material selected from the group consisting of $Al_2O_3$, $Si_3N_4$, BN and PBN.

3. A method of growing a single crystal according to claim 1, wherein said baffle plate is controllably located in the feed melt by being pressed down from above through control rods by a force equal to that necessary to counterbalance the bouyancy of said baffle plate and maintain same at the predetermined spacing from the surface of the feed melt as the crystal is grown.

4. A method of growing a single crystal according to claim 1, wherein said baffle plate is fixed to a control rod which is suspended vertically axially movably from above the crucible.

5. A method of growing a single crystal according to claim 1, further wherein the crucible is moved to maintain the predetermined position of said baffle plate in the crucible during pulling of the single crystal.

* * * * *